US007125755B2

United States Patent
Kuo

(10) Patent No.: US 7,125,755 B2
(45) Date of Patent: *Oct. 24, 2006

(54) METHOD AND STRUCTURE FOR ELECTROSTATIC DISCHARGE PROTECTION OF PHOTOMASKS

(75) Inventor: Kuei-Chi Kuo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 54 days.

This patent is subject to a terminal disclaimer.

(21) Appl. No.: 10/773,597

(22) Filed: Feb. 6, 2004

(65) Prior Publication Data

US 2005/0142699 A1 Jun. 30, 2005

(30) Foreign Application Priority Data

Dec. 30, 2003 (CN) .................. 2003 1 0122964

(51) Int. Cl.
*H01L 21/332* (2006.01)
*H01L 21/479* (2006.01)
(52) U.S. Cl. .................. 438/140; 438/467
(58) Field of Classification Search .......... 216/41; 438/10, 467, 601, 14
See application file for complete search history.

(56) References Cited

U.S. PATENT DOCUMENTS 5,989,754 A * 11/1999 Chen et al. .............. 430/5
5,999,397 A * 12/1999 Chen et al. .............. 361/212
6,216,873 B1 * 4/2001 Fosnight et al. .......... 206/710
6,247,599 B1 * 6/2001 Cheng et al. ............ 206/723
6,291,114 B1 * 9/2001 Reijers .................... 430/5
6,421,113 B1 * 7/2002 Armentrout ............. 355/75
6,513,654 B1 * 2/2003 Smith et al. ............. 206/454
6,893,780 B1 * 5/2005 Galan et al. ............. 430/5
2003/0013258 A1 * 1/2003 Lee ........................ 438/298
2003/0213612 A1 * 11/2003 Wu et al. ................ 174/250
2005/0186488 A1 * 8/2005 Su et al. .................. 430/5

FOREIGN PATENT DOCUMENTS

JP 2002055438 * 2/2002
KR 2001057347 * 7/2001

* cited by examiner

*Primary Examiner*—Mary Wilczewski
*Assistant Examiner*—Toniae M. Thomas
(74) *Attorney, Agent, or Firm*—Townsend and Townsend and Crew LLP

(57) ABSTRACT

A mask for manufacturing integrated circuits and use of the mask. The mask has a mask substrate. The mask also has an active mask region within a first portion of the mask substrate. The active region is adapted to accumulate a pre-determined level of static electricity. The mask also has a first guard ring structure surrounding a portion of the active mask region to isolate the active region from an outer region of the mask substrate and a second guard ring structure having at least one fuse structure surrounding a portion of the first guard ring structure. The fuse structure is operably coupled to the active region to absorb a current from static electricity. The static electricity is accumulated by the active region to the pre-determined level and being discharged as current to the fuse structure while maintaining the active region free from damage from the static electricity.

18 Claims, 10 Drawing Sheets

METHOD AND STRUCTURE FOR ELECTROSTATIC DISCHARGE PROTECTION OF PHOTOMASKS

CROSS-REFERENCES TO RELATED APPLICATIONS

NOT APPLICABLE

Statement as to Rights to Inventions Made Under Federally Sponsored Research or Development

NOT APPLICABLE

Reference to a "Sequence Listing," A Table, or a Computer Program Listing Appendix Submitted on a Compact Disk

NOT APPLICABLE

BACKGROUND OF THE INVENTION

The present invention is directed to integrated circuits and their processing for the manufacture of semiconductor devices. More particularly, the invention provides a method and device for manufacturing a mask structure including an anti-static device and a related integrated circuit device. Merely by way of example, the invention has been applied to guard ring structure on the mask structure for advanced integrated circuit devices for critical masking steps. But it would be recognized that the invention has a much broader range of applicability. For example, the invention can be applied to non-critical steps as well, as well as various interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to form smaller and finer patterns with mask structures. Such mask structures often accumulate static charge that discharge onto the smaller patterns to cause damage on them. Damaged masks transfer damaged patterns onto integrated circuits, which lead to device failures and reliability problems.

Often times, damaged masks are caused by electrostatic discharge problems from charge that accumulates on the active region of the masks. Static charge builds up builds up to thousands of volts, which discharge from one region of the mask onto another region to cause damage to the mask. Many attempts have been made to limit such static discharge. As merely an example, ionizers have been used to remove static charge from the masks. Other techniques include applying electrostatic discharge materials on working surfaces of clean rooms, etc. that are used during the manufacture of integrated circuits with the masks. Unfortunately, human operators still handle the masks, which cause damage to the masks themselves. Such masks often cost tens of thousands of dollars and often require a long lead-time to receive from a vendor of the mask. Accordingly, there are many limitations with conventional masks and their use in the manufacture of integrated circuits.

From the above, it is seen that an improved technique for processing semiconductor devices including photo masks is desired.

BRIEF SUMMARY OF THE INVENTION

According to the present invention, techniques including methods for the manufacture of semiconductor devices are provided. More particularly, the invention provides a method and device for manufacturing a mask structure including an anti-static device and a related integrated circuit device. Merely by way of example, the invention has been applied to guard ring structure on the mask structure for advanced integrated circuit devices for critical masking steps. But it would be recognized that the invention has a much broader range of applicability. For example, the invention can be applied to non-critical steps as well, as well as various interconnect structures.

In a specific embodiment, the invention includes a mask for manufacturing integrated circuits. The mask has a mask substrate. The mask also has an active mask region within a first portion of the mask substrate. The active region is adapted to accumulate a pre-determined level of static electricity. The mask also has a first guard ring structure surrounding a portion of the active mask region to isolate the active region from an outer region of the mask substrate and a second guard ring structure having at least one fuse structure surrounding a portion of the first guard ring structure. The fuse structure is operably coupled to the active region to absorb a current from static electricity. The static electricity is accumulated by the active region to the pre-determined level and being discharged as current to the fuse structure while maintaining the active region free from damage from the static electricity.

In an alternative specific embodiment, the invention includes a method for manufacturing integrated circuit devices. The method includes receiving a mask in a first pod. The mask includes an active region and a guard ring structure having at least one fuse structure. The method includes transferring the mask from the first pod into a second pod within a clean room environment. The method includes handling the mask in the clean room environment and accumulating static electricity on the mask during the handling in the clean room environment. Additionally, the method includes discharging a portion of the static charge to the fuse on the guard ring structure of the mask while maintaining the active region of the mask free from static energy damage. The mask is used in an operation for manufacture of semiconductor integrated circuits.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method and device for manufacturing a mask structure including an anti-static device and a related integrated circuit device. Merely by way of example, the invention has been applied to guard ring structure on the mask structure for advanced integrated circuit devices for critical masking steps. But it would be recognized that the invention has a much broader range of applicability. For example, the invention can be applied to non-critical steps as well, as well as various interconnect structures.

Figure 1:
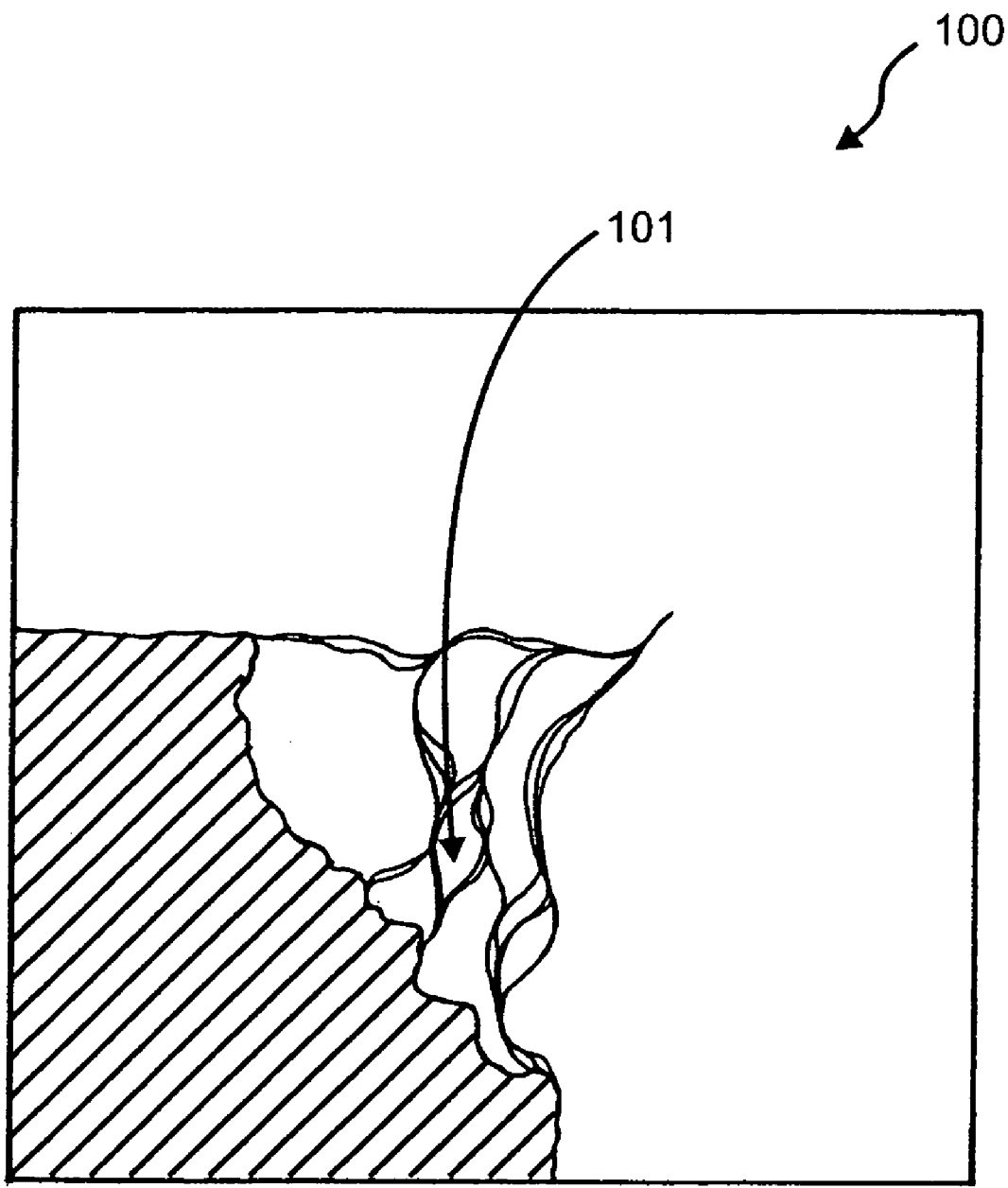
FIGS. 1 through 3 are simplified top-view diagrams of conventional mask structures.
Figure 2:
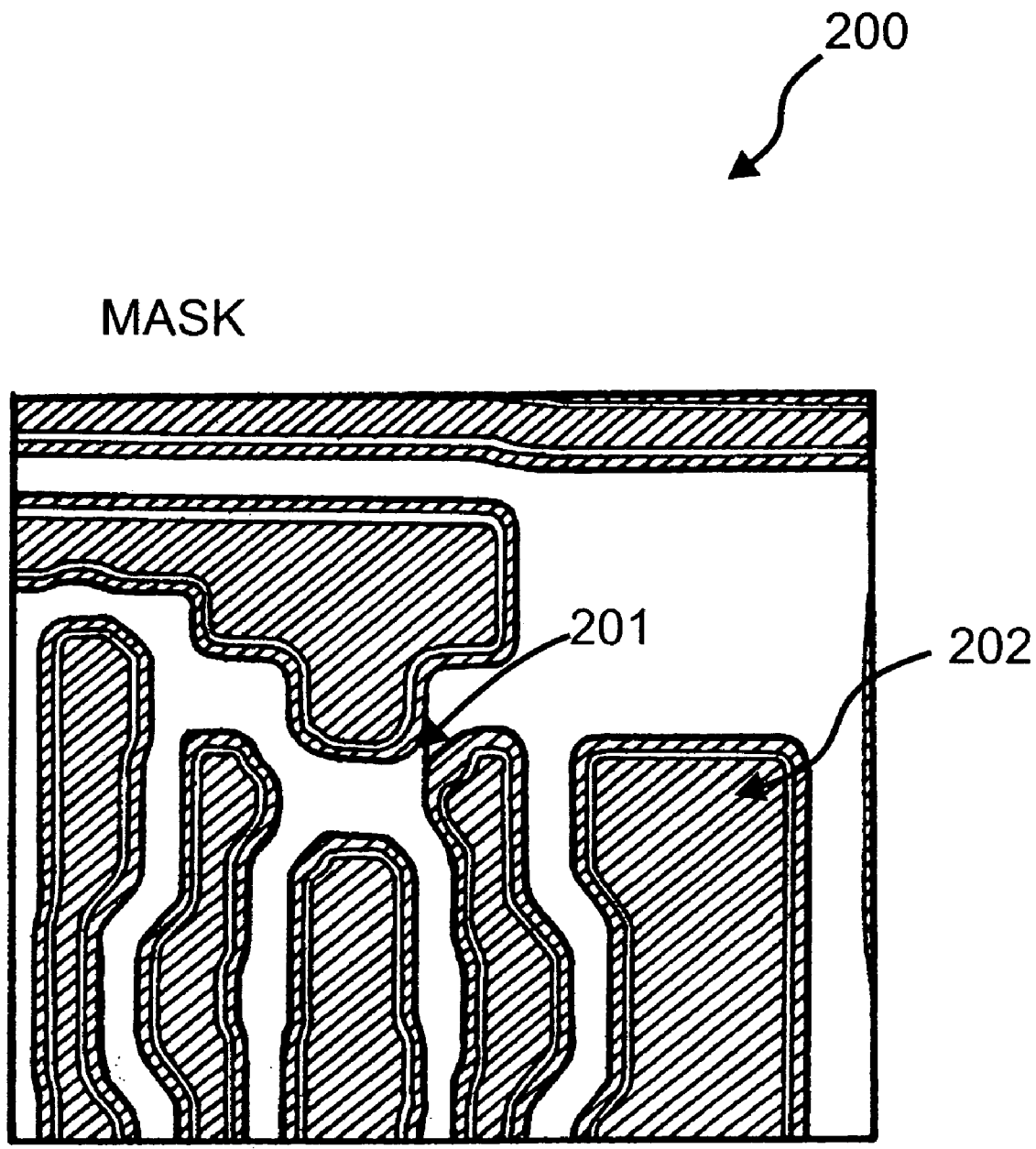
Figure 3:
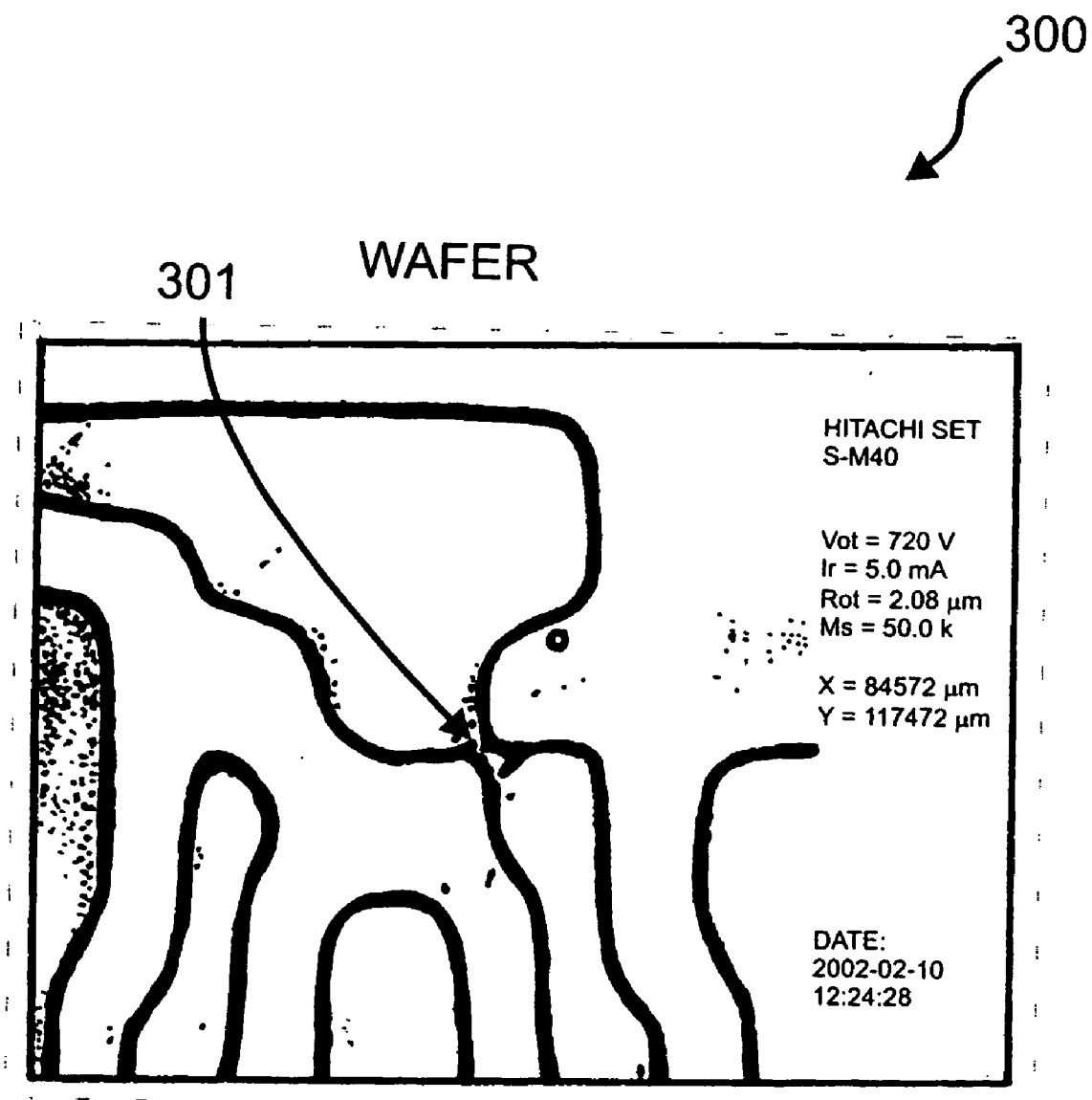

FIGS. 1 through 3 are simplified top-view diagrams 100, 200, 300 of conventional mask structures and pattern on wafer. These diagrams are merely examples, which should not unduly limit the scope of the claims herein. One of ordinary skill in the art would recognize many other variations, modifications, and alternatives. As shown, mask structure 100 includes metal layer that define the pattern and transparent region surrounding the patterned metal layer. The metal can include any suitable for blocking light. Such metal includes, but is not limited to, chrome, nickel, $MoSiO_2$, and Ta. Of course, the type of metal used depends upon the application. Region 101 is a damaged region, which I discovered. The damaged region was caused by electrostatic discharge between two metal line patterns, which are close to each other. A large voltage potential was formed between the two metal line patterns, which shorted together via electrical current connecting the two patterns together. The two metal patterns are 0.8 microns from each other. The voltage potential can be 20,000 and greater before it is discharged.

Figure 3A:
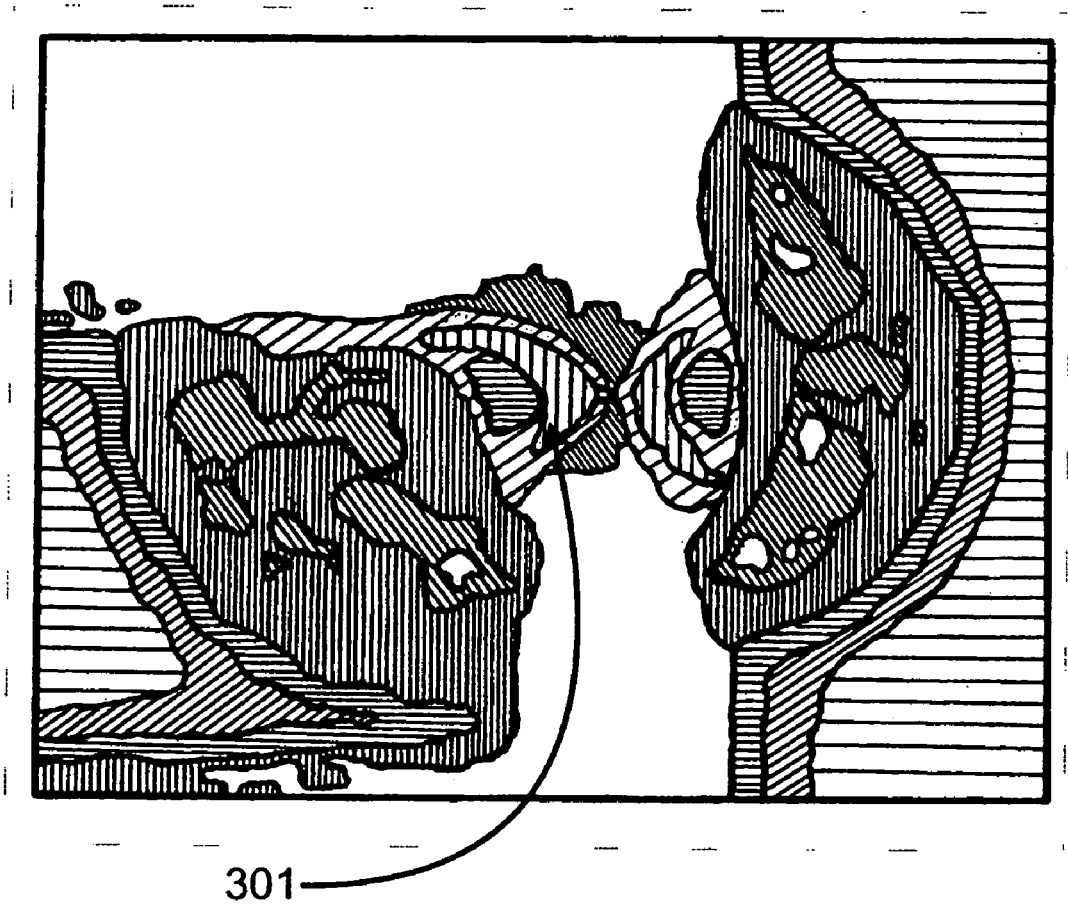

The damaged region is often from a larger pattern structure such as the one 200 in FIG. 2. Damaged region is illustrated by reference numeral 201, which is between two metal line patterns. As shown, the two metal line patterns are shorted together. The metal line pattern 202 is often made of a conductive material such as chrome and/or the like. The damaged region is transposed onto a semiconductor wafer 300 as illustrated by region 301 in FIG. 3. A more detailed diagram of the damaged region 301 is illustrated by the simplified diagram of FIG. 3A. The damage is caused by electrostatic discharge from buildup of charge through a variety of production operations. Such operations include use of the mask on production equipment (e.g., robots), mask transfer pods, which house the mask for delivery, and human operators. As devices become smaller, the damage caused by electrostatic discharge becomes more serious and costly. Details of ways to overcome certain limitations of conventional photo masks are described throughout the present specification and more particularly below.

Figure 4:
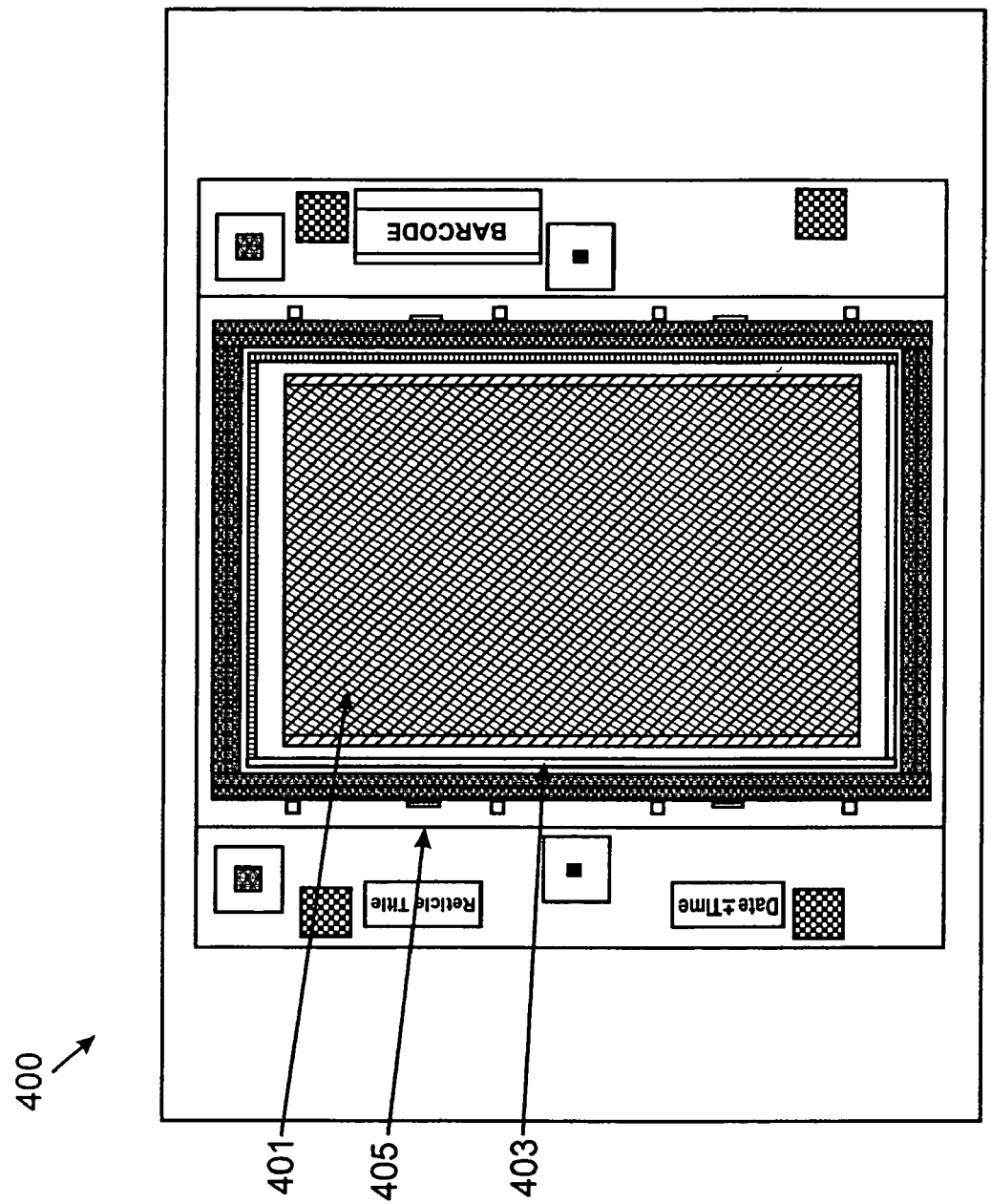
FIGS. 4 through 7 are simplified top-view diagrams of mask structures according to embodiments of the present invention.

FIGS. 4 through 7 are simplified top-view diagrams of mask structures according to embodiments of the present invention. These diagrams are merely examples, which should not unduly limit the scope of the claims herein. One of ordinary skill in the art would recognize many other variations, modifications, and alternatives. Referring to FIG. 4, mask structure 400 includes active region 401, which is composed of patterns for the manufacture of integrated circuits. The patterns are often for either critical or non-critical masking steps. Examples of critical masking steps include 14 of 31 layers in 0.18 micron mask set. Examples of non-critical masking steps include 17 of 31 layers. Of course, critical masking steps often require smaller tolerances than non-critical steps.

Figure 5:
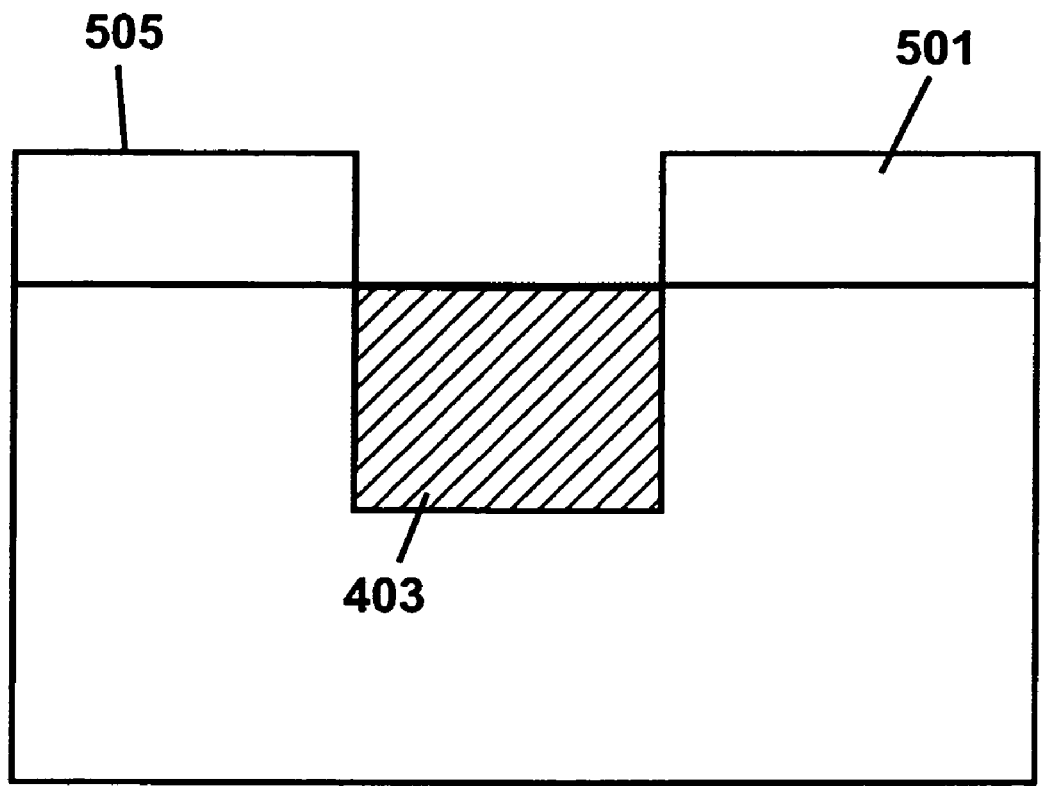
Figure 5A:
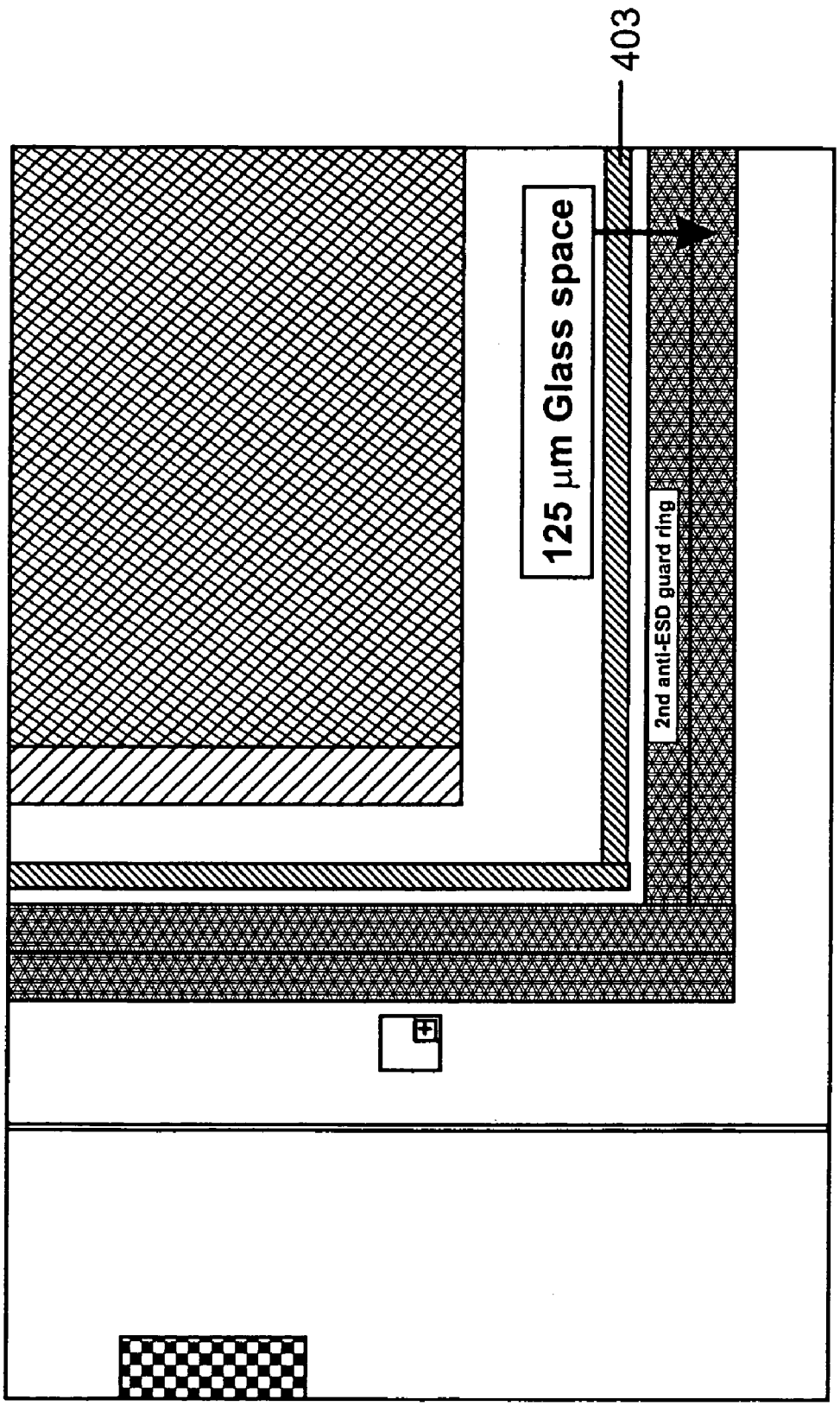

The present mask structure also includes first anti-static guard ring structure 403, which surrounds the periphery of the active region, on the mask structure. The first anti-static guard ring structure serves as isolation between the active region and the second anti-static guard ring structure. The first guard ring structure can be a trench region, which is filled with a dielectric layer. The trench region is free from an overlying metal layer for patterning. Referring to FIG. 5, guard ring 403 is formed in the mask structure, which also includes pattern regions 505, 501. The trench region is often 20 micron and less in width and also 300 nm, to about 1000 nm in thickness, depending upon the embodiment.

Figure 6:
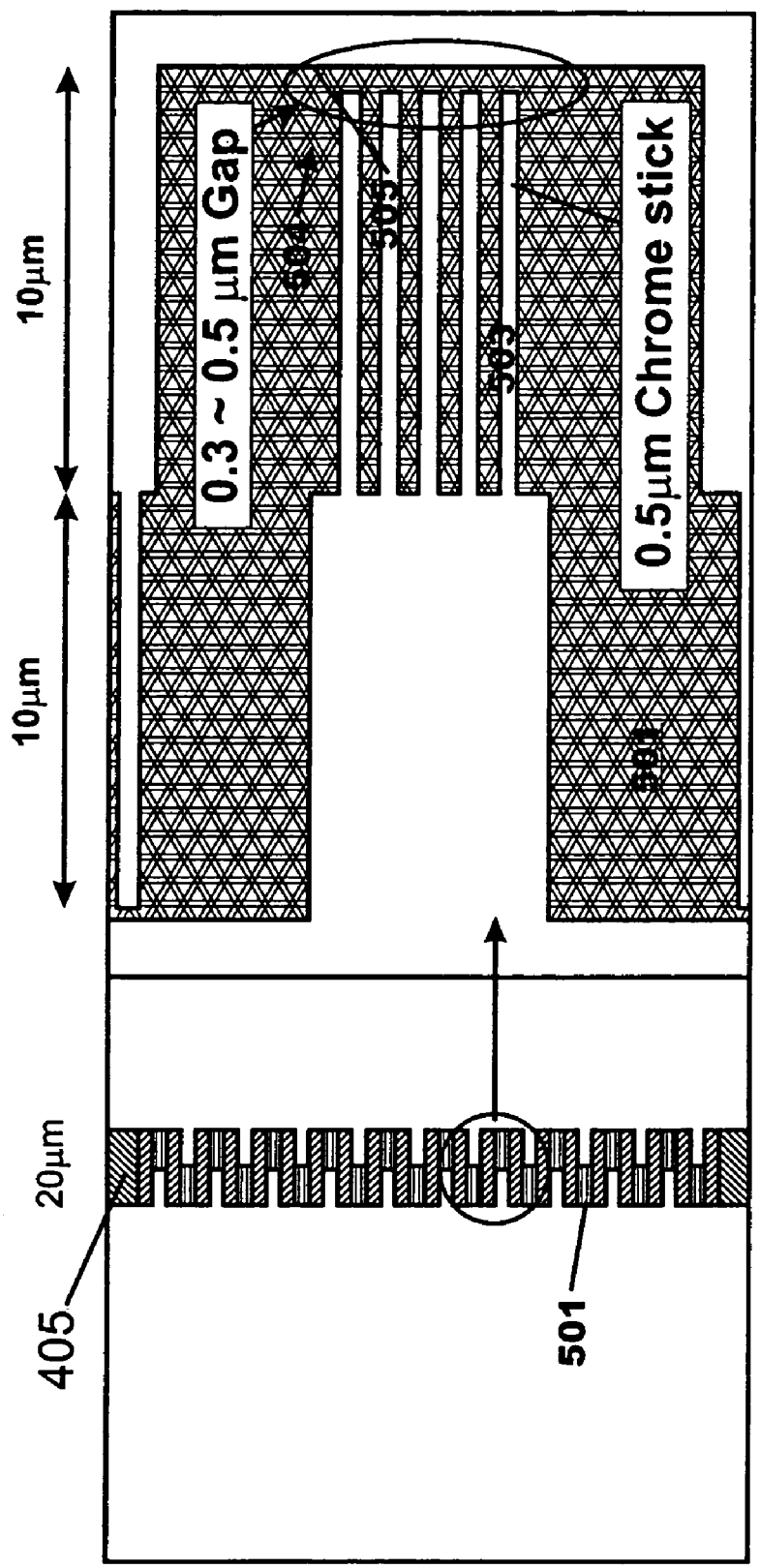

The mask structure also includes a second guard ring structure 405, which surrounds the periphery of the active region and the first guard ring structure. The second guard ring structure includes a plurality of fuse structures, which are defined spatially along the ring. Referring to FIG. 6, the second guard ring structure 405 includes the plurality of fuse structures 501, which are configured in a sequential manner to form the guard ring structure. Each of the fuse structures includes a plurality of elongated members 503, which extend to a common region 504. Each of the elongated members is a finger that has a free end. Each of the elongated members is substantially in parallel with another elongated member. Each of the members extends from metal region 507. Surrounding the metal region is insulating region 501.

Preferably, each of the fuse structures includes the free end, which faces an insulating region. A small gap of insulating material is defined between the free end and conductive structure 505. Conductive structure 505 is a region, which accumulates charge up to a predetermined level. Such predetermined level can be 20,000 volts and greater for 1000 sized lines. Of course, the predetermined level depends upon the application. After the predetermined level, charge traverses from the conductive structure through the small gap to the finger, which acts as an antenna. Once the charge traverses through the small gap, electrostatic energy is discharged. The elongated member may connect to the conductive structure depending upon the application.

Additionally, each of the fuse structures is provided spatially along the guard ring structure. Preferably, each of the structures is placed selectively adjacent to regions, which may potentially have high electric charge accumulation. Alternatively, such structures are selectively placed and spaced in an even manner along the guard ring structures at a predetermined frequency. Depending upon the application, there can be many modifications, alternatives, and variations. Further details of an alternative mask structure are provided throughout the present specification and more particularly below.

Figure 7:
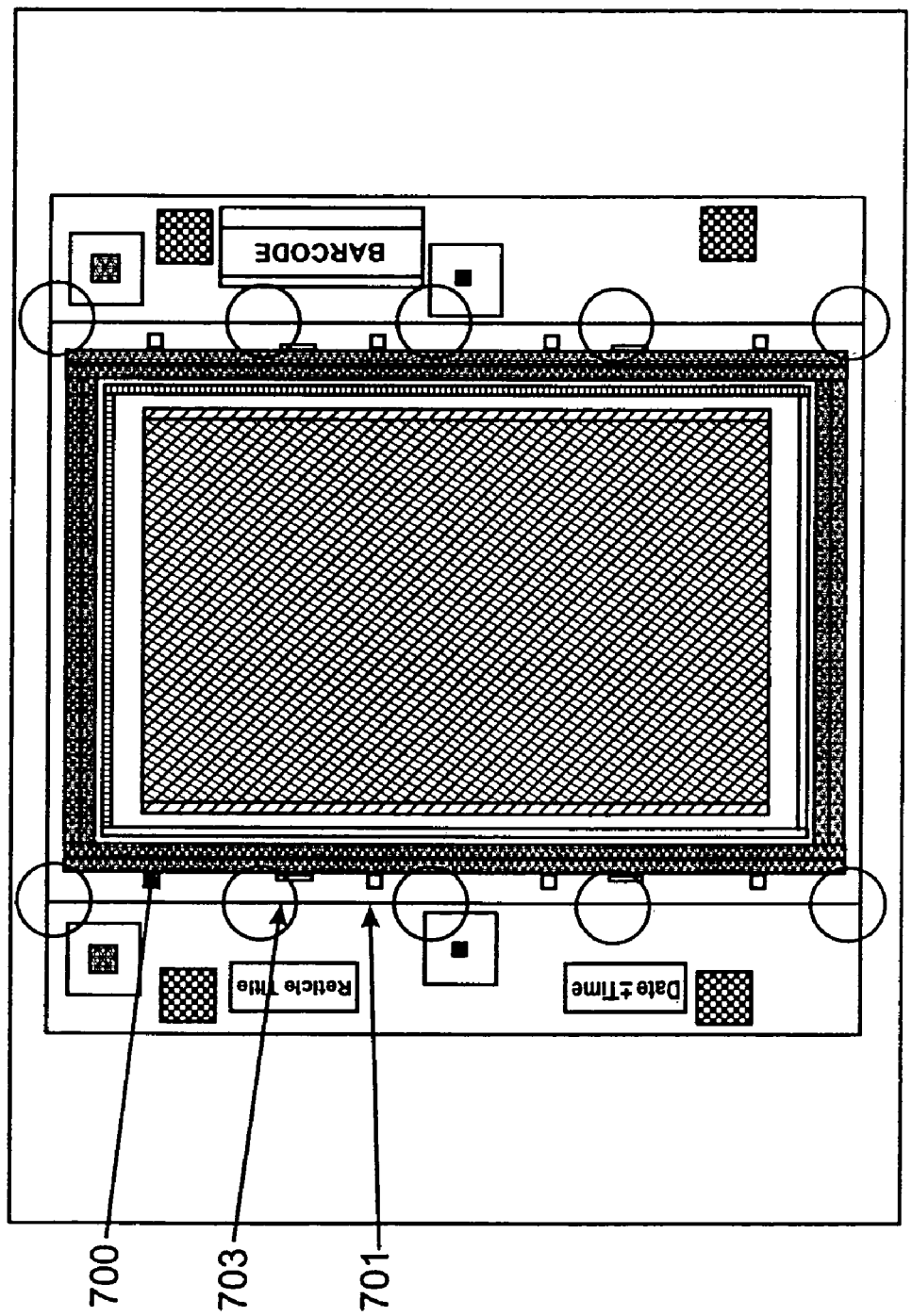

FIG. 7 is a simplified top-view diagram 700 of an alternative mask structure according to an embodiment of the present invention. This diagram is merely an example, which should not unduly limit the scope of the claims herein. One of ordinary skill in the art would recognize many other variations, modifications, and alternatives. As shown, the mask structure 700 includes active region, which is composed of patterns for the manufacture of integrated circuits. The patterns are often for either critical or non-critical masking steps. Examples of critical masking steps include 14 of 31 layers in 0.18 micron mask set. Examples of non-critical masking steps include 17 of 31 layers. Of course, critical masking steps often require smaller tolerances than non-critical steps.

The present mask structure also includes first anti-static guard ring structure 701, which surrounds the periphery of the active region, on the mask structure. The first guard ring structure includes a plurality of fuse structures, which are defined spatially along the ring. Similar to the previous embodiment, the guard ring structure includes the plurality of fuse structures 701, which are configured in a sequential manner to form the guard ring structure. Each of the fuse structures includes a plurality of elongated members, which extend from a first region, which connects each of the members together, to a common region. Each of the elongated members is a finger that has a free end. Each of the elongated members is substantially in parallel with another elongated member. Each of the members extends from metal region 507, which connected each of the members together. Surrounding the metal region is insulating region.

Preferably, each of the fuse structures includes the free end, which faces an insulating region. A small gap of insulating material is defined between the free end and conductive structure 505. Conductive structure 505 is a region, which accumulates charge up to a predetermined level. Such predetermined level can be 20,000 volts and greater for 1000 sized lines. Of course, the predetermined level depends upon the application. After the predetermined level, charge traverses from the conductive structure through the small gap to the finger, which acts as an antenna. Once the charge traverses through the small gap, electrostatic energy is discharged. The elongated member may connect to the conductive structure depending upon the application.

A method according to an embodiment of the present invention can be briefly provided as follows:

1. Provide mask (which has an active region and a guard ring structure having at least one fuse structure);
2. Receive a mask in a first pod from a mask vendor;
3. Transfer the mask from the first pod into a second pod within a clean room environment;
4. Handle the mask in the clean room environment;
5. Accumulate static electricity on one or more portions of the mask during the handling in the clean room environment;
6. Continue to accumulate static electricity on the mask during the handling in the clean room environment up to a predetermined level;
7. Discharge a portion of the static electricity from the one or more portions of the mask to one or more of the fuse structures on the guard ring structure of the mask;
8. Maintain the active region of the mask free from static energy damage as the static electricity is being discharged;
9. Use the mask in an operation for manufacture of semiconductor integrated circuits; and
10. Continue the steps of accumulating charge and discharging such charge onto one or more fuse structures; and
11. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. The present steps allows for static electricity to be discharged onto a guard ring structure without causing damage to active portions of the mask in preferred embodiments. Further details of the present method can be found throughout the present specification and more particularly below.

Figure 8:
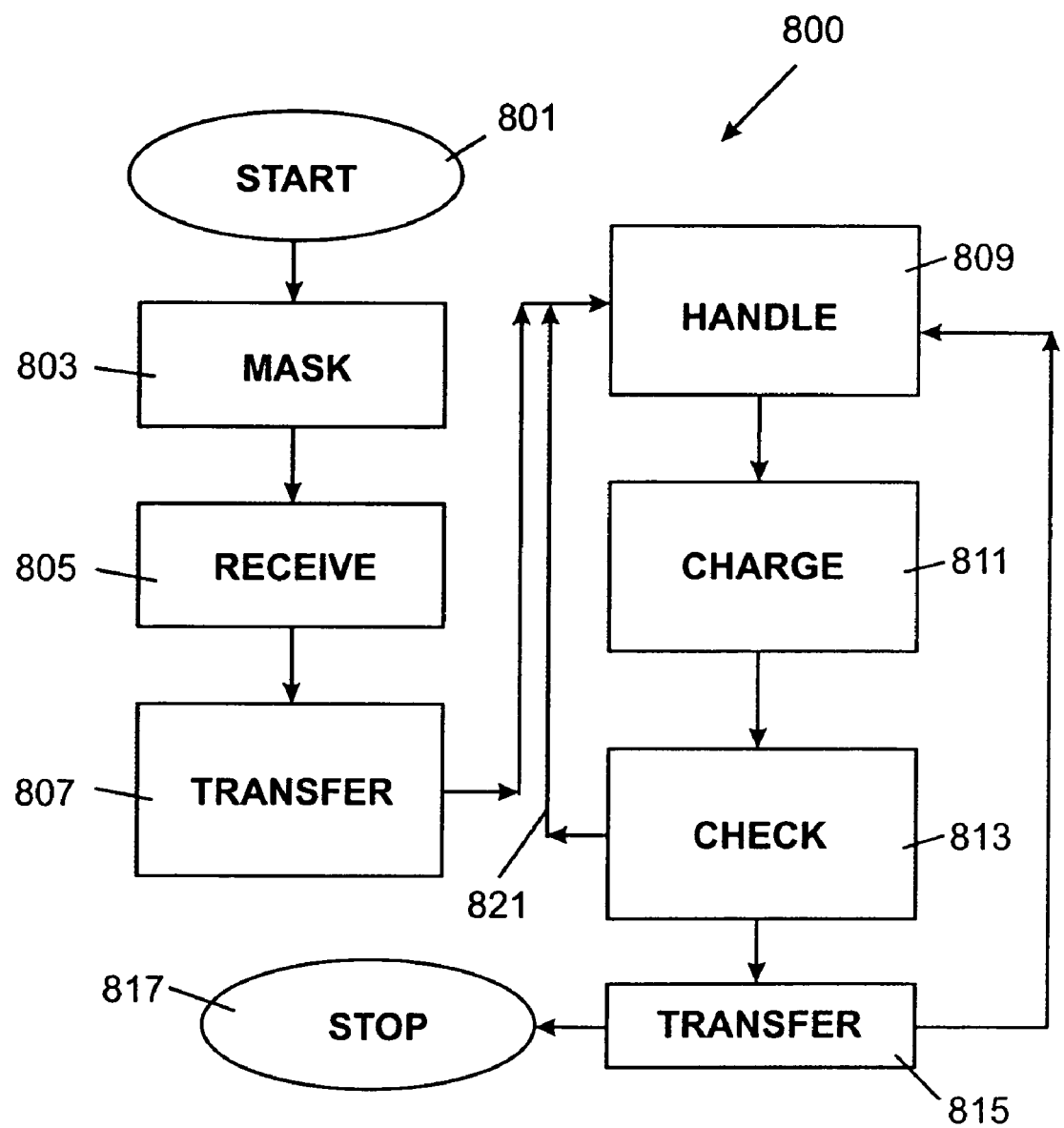
FIG. 8 is a simplified diagram of a method according to embodiments of the present invention

FIG. 8 is a simplified diagram of a method 800 according to embodiments of the present invention. These diagrams are merely examples, which should not unduly limit the scope of the claims herein. One of ordinary skill in the art would recognize many other variations, modifications, and alternatives. As shown, the method begins at start, step 801. The method includes providing (step 803) a mask, which has an active region and a guard ring structure having at least one fuse structure. The mask can be similar to the ones noted above, but can also be others. The method receives (step 805) the mask in a first pod (e.g., mask case) from a mask vendor. Often times, the first pod is a package including antistatic materials to dissipate any charge from the mask. The method includes transferring (step 807) the mask from the first pod into a second pod within a clean room environment. The second pod is often a mask SM17 pod and also has antistatic material to dissipate charge from the mask. Preferably, the pod is sealed, but may not be sealed.

During the manufacture of integrated circuits, the mask is handled (step 809). Depending upon the application, such mask is handled by operators, handled by a robot, inspected, and stored in mask SM17 pod. Each of these handling processes causes electric charge via static electricity to accumulate (step 811) onto one or more portions of the active portions of the mask. The charge accumulates and the method continues via branch 821 to accumulate charge on the one or more portions of the mask in the clean room environment up to a predetermined level. Such predetermined level is often 10,000 volts, but can also be 20,000 volts depending upon the application. Once the mask accumulates such charge to the predetermined level (step 813), the electric charge is discharged and transferred (step 815) from the one or more portions of the mask to one or more of the fuse structures on the guard ring structure of the mask.

Preferably, the method maintains the active region of the mask free from static energy damage as the static electricity is being discharged. The method continues via branch 816 through a portion of the prior steps. Next, the method uses the mask in an operation for manufacture of semiconductor devices. Other alternatives can also be provided where steps are added, one or more steps are removed, or one or more steps are provided in a different sequence without departing from the scope of the claims herein. The present steps allows for static electricity to be discharged onto a guard ring structure without causing damage to active portions of the mask in preferred embodiments. The method stops at step 817.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing integrated circuit devices using a mask, the method comprising:
   receiving a mask in a first pod, the mask including an active region and a guard ring structure having at least one fuse structure, the fuse structure including a plurality of elongated members;
   transferring the mask from the first pod into a second pod within a clean room environment;
   handling the mask in the clean room environment;
   accumulating static electricity on the mask during the handling in the clean room environment;
   discharging a portion of the static charge to the fuse on the guard ring structure of the mask while maintaining the active region of the mask free from static energy damage; and
   using the mask in an operation for manufacture of semiconductor integrated circuits.

2. The method of claim 1 wherein the operation is a lithography process.

3. The method of claim 1 wherein the static energy is characterized by a voltage of 1000 volts.

4. The method of claim 1 wherein the static energy is characterized by a voltage of greater than 3000 volts.

5. The method of claim 1 wherein each of the elongated members is a finger including a free end facing an insulating region.

6. The method of claim 5 wherein a small gap is defined between the free end and a conductive structure.

7. The method of claim 5 wherein the conductive structure is a region where electrostatic charge is accumulated.

8. The method of claim 6 wherein charge traverses from the conductive structure through the small gap to the finger.

9. The method of claim 8 wherein the finger acts as an antenna and once the charge traverses through the small gap, electrostatic charge is discharged.

10. A method for manufacturing integrated circuit devices using a mask, the method comprising:
    receiving a mask in a first pod, the mask including an active region and an anti-static guard ring structure, the guard ring structure further including a first guard ring structure and a second guard ring structure having a plurality of fuse structures;
    transferring the mask from the first pod into a second pod within a clean room environment;
    handling the mask in the clean room environment;
    discharging electrostatic charges built up from the handling of the mask to the plurality of fuse structures of the mask while maintaining the active region of the mask free from damage caused by electrostatic charges; and
    using the mask in an operation for manufacture of semiconductor integrated circuits.

11. The method of claim 10 wherein the first guard ring structure serves as isolation between the active region and the second guard ring structure.

12. The method of claim 10 wherein the first guard ring structure comprises a trench region filled with a dielectric layer.

13. The method of claim 12 wherein the trench region is 20 micron or less in width and 300 nm to 1000 nm in thickness.

14. The method of claim 10 wherein the second guard ring structure surrounds the periphery of the active region and the first guard ring structure.

15. The method of claim 10 wherein the second guard ring structure includes a plurality of fuse structures configured to form the guard ring structure in a sequential manner.

16. The method of claim 15 wherein each of the fuse structures includes a plurality of elongated members.

17. The method of claim 16 wherein each of the elongated members is a finger having a free end.

18. The method of claim 17 wherein each of the elongated members is substantially in parallel with another elongated member.

* * * * *